(12) United States Patent
Zhou

(10) Patent No.: US 8,569,137 B1
(45) Date of Patent: Oct. 29, 2013

(54) METHOD OF IMPROVING PMOS PERFORMANCE IN A CONTACT ETCH STOP LAYER PROCESS

(71) Applicant: Shanghai Huali Microelectronics Corporation, Shanghai (CN)

(72) Inventor: Jun Zhou, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 13/730,169

(22) Filed: Dec. 28, 2012

(30) Foreign Application Priority Data

May 28, 2012 (CN) .......................... 2012 1 0169475

(51) Int. Cl.
*H01L 21/8234* (2006.01)
(52) U.S. Cl.
USPC .................... 438/275; 438/199; 257/E21.632
(58) Field of Classification Search
USPC ................. 438/199, 223, 224, 275, 227–228; 257/E21.632
See application file for complete search history.

(56) References Cited

U.S. PATENT DOCUMENTS 7,297,584 B2 * 11/2007 Park et al. ..................... 438/199

* cited by examiner

*Primary Examiner* — Thanhha Pham
(74) *Attorney, Agent, or Firm* — Muncy, Geissler, Olds & Lowe, PLLC

(57) ABSTRACT

A method of improving PMOS performance in a contact etch stop layer process is disclosed. The method includes: a first step for sequentially forming a first silicon dioxide layer, a hydrogen-containing silicon nitride layer and a second silicon dioxide layer on a semiconductor wafer; a second step for etching the second silicon dioxide layer; a third step for irradiating the resulting structure obtained after the step 2 with ultra-violet light; and a fourth step for removing the portions of the second silicon dioxide layer remained over the PMOS devices. By irradiating the low-stress silicon nitride layer deposited over the NMOS devices by UV light, a high tensile stress is generated in the silicon nitride over the NMOS devices while there is no high tensile stress in the silicon nitride over the PMOS devices, thus reducing disadvantageous effects of the CESL process on the performance of PMOS devices.

8 Claims, 2 Drawing Sheets

METHOD OF IMPROVING PMOS PERFORMANCE IN A CONTACT ETCH STOP LAYER PROCESS

CROSS-REFERENCES TO RELATED APPLICATIONS

This application claims the priority of Chinese patent application number 201210169475.4, filed on May 28, 2012, the entire contents of which are incorporated herein by reference.

TECHNICAL FIELD

The present invention relates to semiconductor fabrication, and more particularly, to a method of improving PMOS performance in a contact etch stop layer (CESL) process.

BACKGROUND

With the development of CMOS (complementary metal oxide semiconductor) process and the continuous downscaling of CMOS devices, stress engineering has been playing a more and more importance role in semiconductor processes and device performance. Introduction of stress into CMOS devices is mainly for carrier mobility enhancement, but different types of stresses will have different effects on carrier mobility of the device.

Specifically, a compressive liner will enhance the hole mobility of PMOS devices and thus will significantly improve performance thereof, whilst a tensile liner will reduce the hole mobility of PMOS devices and thus will degrade performance thereof. Similarly, a tensile liner will enhance the electron mobility of NMOS devices and thus will significantly improve performance thereof, whilst a compressive liner will reduce the electron mobility of NMOS devices and thus will degrade performance thereof.

Contact etch stop layer (CESL) process is a stress introduction practice commonly used in the CMOS process. Traditional CESL process is capable of forming a tensile liner to cover the NMOS devices and a compressive liner to cover the PMOS devices to improve the electron and hole mobility therein, respectively, and thus capable of enhancing the performance of NMOS and PMOS devices.

Nevertheless, this CESL process has an extremely high complexity. Moreover, additional compressive stress is not needed in 65 nm PMOS devices and their performance can be ensured if there is no degradation in compressive stress.

In the first-generation CESL process, generally only silicon nitride films providing tensile stress were utilized. As indicated above, because NMOS and PMOS devices need opposite types of stress for performance improvement, beneficial effects of such stress generation films for NMOS devices were always accompanied with disadvantageous effects on the performance of PMOS devices.

Thus, there is a need for a method of effectively improving PMOS performance in the CESL process.

SUMMARY OF THE INVENTION

The present invention addresses the aforementioned issues of the prior art by presenting an effective method of improving PMOS performance in a contact etch stop layer (CESL) process.

According to the present invention, a method of improving PMOS performance in a contact etch stop layer (CESL) process is provided. The method includes the following steps:

step 1, sequentially forming a first silicon dioxide layer, a hydrogen-containing silicon nitride layer and a second silicon dioxide layer on a semiconductor wafer having at least one PMOS device and at least one NMOS device formed thereon;

step 2, etching the second silicon dioxide layer such that portions of the second silicon dioxide layer over the at least one NMOS device are removed and portions of the second silicon dioxide layer over the at least one PMOS device are remained;

step 3, irradiating the resulting structure obtained after step 2 with ultra-violet light; and step 4, removing the portions of the second silicon dioxide layer remained over the at least one PMOS device.

Preferably, in this method, at least one P-doped well and at least one N-doped well are arranged in a substrate of the silicon wafer, wherein each NMOS device is formed in a corresponding P-doped well, and each PMOS device is formed in a corresponding N-doped well.

Preferably, in this method, step 1 is realized by chemical vapor deposition (CVD).

Preferably, in this method, the first silicon dioxide layer has a thickness of 100 Å to 300 Å.

Preferably, in this method, the hydrogen-containing silicon nitride layer has a thickness of 400 Å to 800 Å.

Preferably, in this method, the second silicon dioxide layer has a thickness of 100 Å to 300 Å.

Preferably, in this method, step 2 includes: protecting the portions of the second silicon dioxide layer over the at least one PMOS device with photoresist, and then removing the portions of the second silicon dioxide layer over the at least one NMOS device by etching.

Preferably, in this method, the second silicon dioxide layer is wet etched in step 2.

In the method of the present invention, by irradiating the low-stress silicon nitride deposited over the NMOS devices with UV light so as to generate a high tensile stress therein with no high tensile stress generated in the silicon nitride over the PMOS devices, disadvantageous effects of the CESL process on the performance of PMOS devices can be reduced.

BRIEF DESCRIPTION OF THE DRAWINGS

The present invention with its accompanying advantages and features will be more readily understood from the following detailed description taken in conjunction with the accompanying drawings, in which.

Note that the accompanying drawings may not be to scale, and are incorporated to depict the invention only. Therefore, the drawings should not be construed in any manner that they

DETAILED DESCRIPTION

Upon reading the following description of specific embodiments in conjunction with the accompanying drawing figures, the concepts of the present invention will be clearer and easier to be understood. The PMOS/NMOS device mentioned below could be a PMOS/NMOS transistor, a PMOS/NMOS Field Effect Transistor or other PMOS/NMOS structures.

A method of improving p-type metal-oxide-semiconductor (PMOS) performance in a contact etch stop layer (CESL) process according to an embodiment of the present invention will be described below with reference to FIGS. 1 to 4.

As shown in FIGS. 1 to 4, the method according to the embodiment of the present invention includes the steps as follows.

At first, a first step is performed to sequentially form a first silicon dioxide layer 5, a hydrogen-containing silicon nitride layer 6 and a second silicon dioxide layer 7 on a semiconductor wafer having at least one PMOS device and at least one NMOS device formed thereon.

Figure 1:
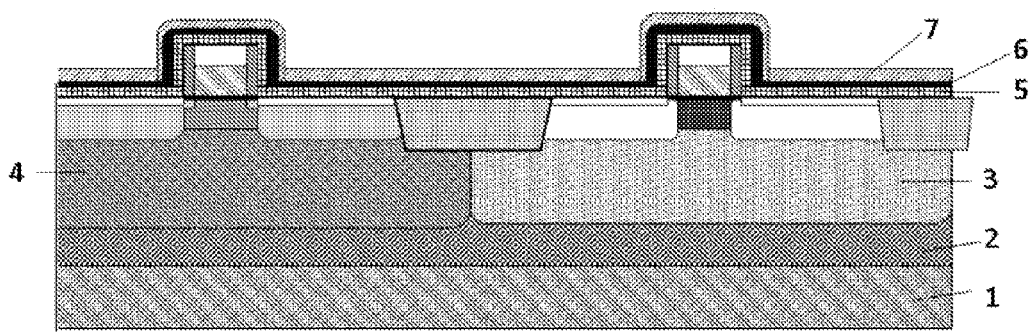
FIG. 1 is a schematic diagram illustrating a structure formed after step 1 of the method of improving PMOS performance in CESL process according to an embodiment of the present invention.

Specifically, at least one P-doped well 3 and at least one N-doped well 4 are arranged in the substrate 1 of the silicon wafer. Each NMOS device is formed in a corresponding P-doped well 3, and each PMOS device is formed in a corresponding N-doped well 4. FIG. 1 is a schematic diagram illustrating a structure including one PMOS device formed in an N-doped well 4 and one NMOS device formed in a P-doped well 3 after performing the first step of the method according to this embodiment of the present invention.

Preferably, the first step is realized by chemical vapor deposition (CVD), namely the first silicon dioxide layer 5, the hydrogen-containing silicon nitride layer 6 and the second silicon dioxide layer 7 are all formed by CVD.

Moreover, preferably, the first silicon dioxide layer 5 has a thickness of 100 Å to 300 Å.

Preferably, the hydrogen-containing silicon nitride layer 6 is a hydrogen-rich, low-stress silicon nitride thin film. And preferably, the hydrogen-containing silicon nitride layer 6 has a thickness of 400 Å to 800 Å.

Preferably, the second silicon dioxide layer 7 has a thickness of 100 Å to 300 Å.

Figure 2:
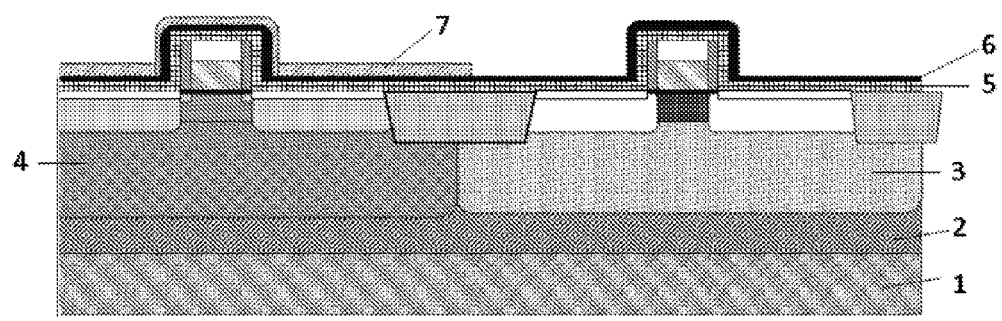
FIG. 2 is a schematic diagram illustrating a structure formed after step 2 of the method of improving PMOS performance in CESL process according to the embodiment of the present invention.

Next, a second step is carried out to etch the second silicon dioxide layer 7 such that portions of the second silicon dioxide layer 7 over the at least one NMOS device are removed and portions of the second silicon dioxide layer 7 over the at least one PMOS device are remained. FIG. 2 is a schematic diagram illustrating a structure formed after the second step of the method according to this embodiment of the present invention.

More specifically, in specific embodiments, in the second step, the result that "portions of the second silicon dioxide layer 7 over at least one NMOS device are removed and portions of the second silicon dioxide layer 7 over at least one PMOS device are remained" can be reached by first protecting the portions of the second silicon dioxide layer 7 over the at least one PMOS device with photoresist (not shown), and then removing (e.g., by wet etching) the portions of the second silicon dioxide layer 7 over the at least one NMOS device.

Figure 3:
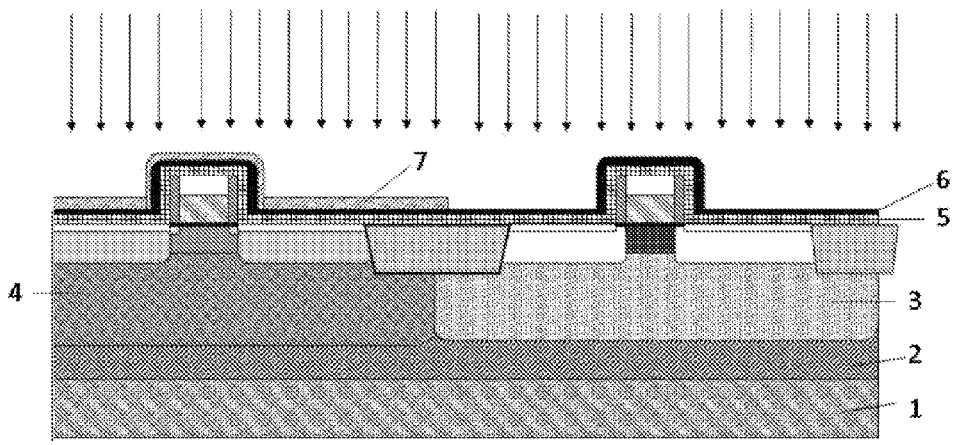
FIG. 3 is a schematic diagram illustrating step 3 of the method of improving PMOS performance in CESL process according to the embodiment of the present invention.

After that, a third step is performed to irradiate the resulting structure obtained after the second step with ultra-violet (UV) light, such that a high tensile stress is formed in the low-stress silicon nitride (namely the hydrogen-containing silicon nitride layer 6) over the at least one NMOS device while there is no high tensile stress in the silicon nitride over the at least one PMOS device. In this step, the portions of the hydrogen-containing silicon nitride layer 6 over the at least one NMOS device are solidified after they are irradiated by the UV light. FIG. 3 is a schematic diagram illustrating the third step of the method according to this embodiment of the present invention, wherein arrows indicate the UV light radiation.

Figure 4:
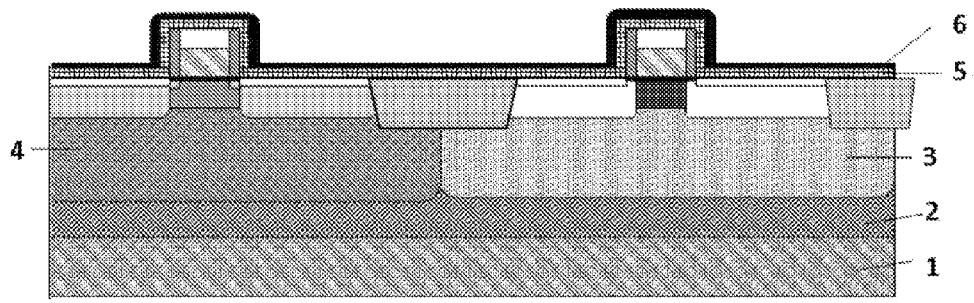
FIG. 4 is a schematic diagram illustrating a structure formed after step 4 of the method of improving PMOS performance in CESL process according to the embodiment of the present invention.

At last, a forth step is carried out to remove the portions of the second silicon dioxide layer 7 remained over the at least one PMOS device. For example, the portions of the second silicon dioxide layer 7 may be removed preferably by wet etching. FIG. 4 is a schematic diagram illustrating a structure formed after the fourth step of the method according to this embodiment of the present invention.

Overall, disadvantageous effects of the CESL process on the performance of PMOS devices can be reduced in the embodiment of the present invention, by at first depositing a first silicon dioxide layer (e.g., a silicon dioxide thin film), a hydrogen-containing silicon nitride layer (e.g., a hydrogen-rich, low-stress silicon nitride thin film) and a second silicon dioxide layer (i.e., another silicon dioxide thin film), then removing (e.g. by wet etching) portions of the second silicon dioxide layer over the at least one NMOS device and leaving portions of the second silicon dioxide layer over the at least one PMOS device remained; after that, irradiating the resulting structure with UV light such that a high tensile stress is generated in silicon nitride over the at least one NMOS device while there is no high tensile stress in silicon nitride over the at least one PMOS device, and at last removing (e.g. by wet etching) the portions of the second silicon dioxide layer remained over the at least one PMOS device.

According to another preferred embodiment, the present invention also provides a contact etch stop layer (CESL) process method employing the above method of improving performance of PMOS devices in CESL process. Further, according to yet another preferred embodiment, the present invention also provides a semiconductor device fabrication method employing the aforementioned CESL process method.

While this invention has been particularly shown and described with respect to foregoing preferred embodiments, it will be understood that they are not intended to limit the scope of the present invention in any way. Accordingly, those skilled in the art will appreciate that various alternative and equivalent embodiments can be made based on the disclosure. In addition, those skilled in the art can make various modifications and variations of the present invention without departing from the scope and spirit of the invention. Thus, it is intended that the present invention covers all such simple changes, equivalent variations and modifications provided they come within the scope of the present invention.

What is claimed is:

1. A method of improving PMOS performance in a contact etch stop layer (CESL) process, the method comprising:
   step 1, sequentially forming a first silicon dioxide layer, a hydrogen-containing silicon nitride layer and a second silicon dioxide layer on a semiconductor wafer having at least one PMOS device and at least one NMOS device formed thereon;
   step 2, etching the second silicon dioxide layer such that portions of the second silicon dioxide layer over the at least one NMOS device are removed and portions of the second silicon dioxide layer over the at least one PMOS device are remained;

step 3, irradiating the resulting structure obtained after step 2 with ultra-violet light; and step 4, removing the portions of the second silicon dioxide layer remained over the at least one PMOS device.

2. The method according to claim 1, wherein at least one P-doped well and at least one N-doped well are arranged in a substrate of the silicon wafer, wherein each NMOS device is formed in a corresponding P-doped well, and each PMOS device is formed in a corresponding N-doped well.

3. The method according to claim 1, wherein step 1 is realized by chemical vapor deposition.

4. The method according to claim 1, wherein the first silicon dioxide layer has a thickness of 100 Å to 300 Å.

5. The method according to claim 1, wherein the hydrogen-containing silicon nitride layer has a thickness of 400 Å to 800 Å.

6. The method according to claim 1, wherein the second silicon dioxide layer has a thickness of 100 Å to 300 Å.

7. The method according to claim 1, wherein step 2 includes: protecting the portions of the second silicon dioxide layer over the at least one PMOS device with photoresist, and then removing the portions of the second silicon dioxide layer over the at least one NMOS device by etching.

8. The method according to claim 1, wherein in step 2, the second silicon dioxide layer is wet etched.

\* \* \* \* \*